(12) United States Patent
Yoo et al.

(10) Patent No.: US 7,803,653 B2
(45) Date of Patent: Sep. 28, 2010

(54) METHOD OF MANUFACTURING IMAGE SENSOR

(75) Inventors: Gil-sang Yoo, Bucheon-si (KR); Byung-jun Park, Yongin-si (KR); Yun-ki Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 284 days.

(21) Appl. No.: 11/834,818

(22) Filed: Aug. 7, 2007

(65) Prior Publication Data

US 2008/0038864 A1 Feb. 14, 2008

(30) Foreign Application Priority Data

Aug. 10, 2006 (KR) .................... 10-2006-0075825

(51) Int. Cl.
*H01L 21/00* (2006.01)
(52) U.S. Cl. .................. 438/71; 257/620; 257/E31.038
(58) Field of Classification Search ............ 438/48–98; 257/620, E31.038
See application file for complete search history.

(56) References Cited

U.S. PATENT DOCUMENTS

| 7,276,429 | B2 * | 10/2007 | Yamanaka | .................. | 438/455 |
| 2003/0214595 | A1 * | 11/2003 | Mabuchi | ..................... | 348/294 |
| 2005/0031995 | A1 * | 2/2005 | Kang et al. | .................. | 430/311 |
| 2007/0063317 | A1 * | 3/2007 | Kim et al. | ..................... | 257/622 |

FOREIGN PATENT DOCUMENTS

| JP | 2005-150463 | 6/2005 |
| JP | 2005-268738 | 9/2005 |
| JP | 2006-19757 | 1/2006 |
| JP | 2006-086226 | 3/2006 |
| KR | 10-2005-0047481 | 5/2005 |
| KR | 10-2006-0075716 | 7/2006 |

OTHER PUBLICATIONS

English Abstract Publication No. 1020060075716.
English Abstract Publication No. 2006-019757.
English Abstract Publication No. 1020050047481.
Korean Notice of Allowance: 9-5-2007-065066545; Nov. 30, 2007.

* cited by examiner

*Primary Examiner*—Steven J Fulk
(74) *Attorney, Agent, or Firm*—F. Chau & Associates, LLC

(57) ABSTRACT

A method of manufacturing an image sensor includes forming a device isolation region in an active pixel sensor area of a semiconductor substrate and alignment keys in a scribe lane area of the semiconductor substrate, such that the depth of the alignment keys is equal to or shallower than the depth of the device isolation region. The method further includes forming a photoelectric converter in the active pixel sensor area, polishing a rear surface of the semiconductor substrate and using the alignment keys to form a microlens at a position corresponding to the photoelectric converter on the polished rear surface of the semiconductor substrate.

18 Claims, 17 Drawing Sheets

METHOD OF MANUFACTURING IMAGE SENSOR

This application claims priority from Korean Patent Application No. 10-2006-0075825 filed on Aug. 10, 2006, the disclosure of which is hereby incorporated by reference herein in its entirety.

BACKGROUND OF THE INVENTION

1. Technical Field

The present disclosure relates to a method of manufacturing an image sensor, and more particularly, to a method of manufacturing an image sensor capable of using alignment keys formed in a scribe lane area.

2. Description of the Related Art

Image sensors are semiconductor devices for converting incident light into electric signals. The image sensors may be divided into two main types of, for example, charge coupled devices (CCDs) and complementary metal oxide semiconductors (CMOS) image sensors.

A charge coupled device may have metal oxide semiconductors (MOS) capacitors adjacent to one another, and the MOS capacitor stores charge and transfers the charge. Meanwhile, the CMOS image sensor may have a plurality of unit pixels for converting charge into a voltage, and outputs signals from signal lines by a switching operation. Due to an increase in the degree of integration of semiconductor devices, the size of a pixel of a CMOS image sensor should therefore be reduced and the degree of integration of the CMOS image sensor should also be improved.

A CMOS image sensor may include an active pixel sensor area in which a plurality of unit pixels are arranged in a matrix and a peripheral circuit area in which peripheral circuits for controlling the unit pixels or processing signals of the unit pixels are formed. For example, the active pixel sensor area may be divided into a photoelectric converter for converting light energy into electric signals and a logic element for processing the converted electric signals to generate data.

With a conventional CMOS image sensor light may be emitted from a lens formed on a plurality of wiring layers to a photoelectric converter through the wiring layers. However, with a conventional CMOS image sensor, an insufficient amount of light may reach the photoelectric converter due to the layout of the multi-layer wiring line. For example, the layout of the multi-layer wiring line may reduce the aperture ratio of the photoelectric converter, which thereby may cause light incident on the photoelectric converter to be markedly reduced, resulting in low sensitivity.

To solve the above-mentioned difficulty, a back-illuminated image sensor has been proposed. With a back-illuminated image sensor, light may be illuminated from the back side (e.g., the side opposite to a wiring portion) of the semiconductor substrate, and the photoelectric converter receives the light. In this way, it is possible to improve the effective aperture ratio without hindrance due to the layout of a plurality of wiring layers and to significantly raise sensitivity as well.

However, with a back-illuminated image sensor, alignment keys, which are used as alignment marks for forming the microlens, may also be needed. Therefore, as a result, an additional process of forming the alignment keys may also be needed.

SUMMARY OF THE INVENTION

Exemplary embodiments of the present invention provide a method of manufacturing an image sensor capable of using alignment keys formed in a scribe lane area.

In accordance with an exemplary embodiment of the present invention, a method of manufacturing an image sensor is provided. The method includes forming a device isolation region in an active pixel sensor area of a semiconductor substrate and alignment keys in a scribe lane area of the semiconductor substrate, such that the depth of the alignment keys is equal to or shallower than the depth of the device isolation region. The method further includes forming a photoelectric converter in the active pixel sensor area, polishing a rear surface of the semiconductor substrate and using the alignment keys to form a microlens at a position corresponding to the photoelectric converter on the polished rear surface of the semiconductor substrate.

In accordance with an exemplary embodiment of the present invention, a method of manufacturing an image sensor is provided. The method includes forming a device isolation region in an active pixel sensor area of a semiconductor substrate and alignment keys in a scribe lane area of the semiconductor substrate, such that the depth of the alignment keys is equal to or shallower than the depth of the device isolation region. The method further includes forming a photoelectric converter in the active pixel sensor area, forming a multi-layer wiring line in an interlayer insulating film formed on the active pixel sensor area, polishing a rear surface of the semiconductor substrate, forming a mask pattern for opening the scribe lane area on the entire polished rear surface of the semiconductor substrate, etching the polished rear surface of the semiconductor substrate using the mask pattern to expose the alignment keys and using the alignment keys to form a microlens at a position corresponding to the photoelectric converter on the polished rear surface of the semiconductor substrate.

BRIEF DESCRIPTION OF THE DRAWINGS

Exemplary embodiments of the present invention can be understood in more detail from the following description in conjunction with the attached drawings in which.

DETAILED DESCRIPTION OF THE EXEMPLARY EMBODIMENTS OF THE INVENTION

Figure 1:
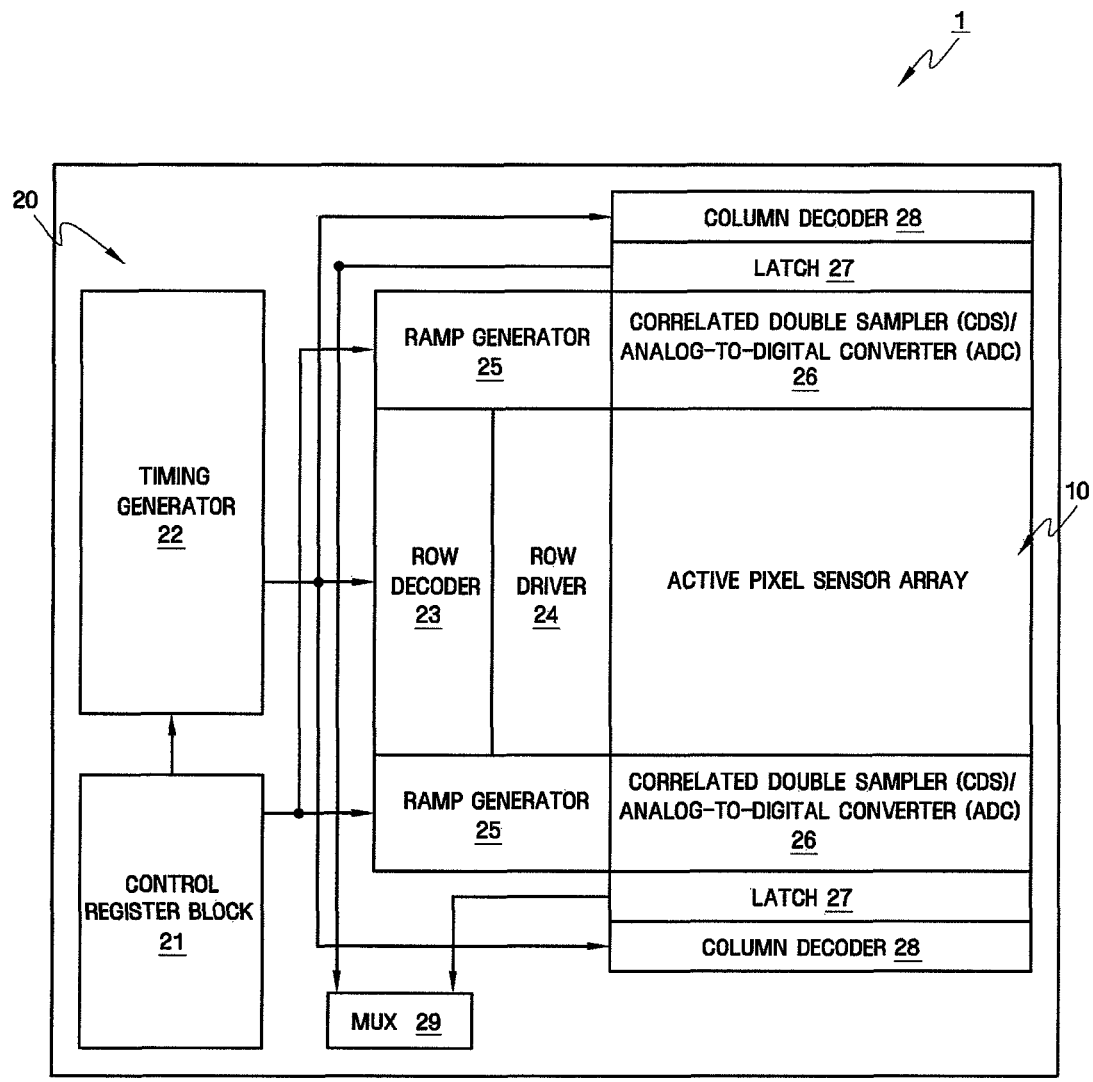
FIG. 1 is a block diagram illustrating an image sensor according to an exemplary embodiment of the invention.

The present invention may, however, be embodied in many different forms and should not be construed as being limited to the exemplary embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

An exemplary embodiment of the present invention will now be described more fully with reference to the accompanying drawings.

FIG. 1 is a block diagram illustrating an image sensor according to an exemplary embodiment of the present invention.

Referring to FIG. 1, an image sensor 1 according to an exemplary embodiment of the invention includes two main areas, that is, an active pixel sensor area 10 and a peripheral circuit area 20.

The active pixel sensor area 10 includes a plurality of unit pixels arranged in a matrix. The plurality of unit pixels absorb the energy of light reflected from an object and convert the energy into electric signals. The active pixel sensor area 10 operates in response to a plurality of driving signals, such as a pixel selection signal ROW, a reset signal RST, and a charge transmission signal TG, received from a row driver 24. The active pixel sensor area 10 provides the converted electric signal to a correlated double sampler/analog-to-digital converter 26 via a vertical signal line. The unit pixel will be described in detail below with reference to FIG. 2.

The peripheral circuit area 20 controls the unit pixels in the active pixel sensor area 10 or processes signals of the unit pixels. The peripheral circuit area 20 includes a control register block 21, a timing generator 22, a row decoder 23, the row driver 24, a ramp generator 25, the correlated double sampler/analog-to-digital converter 26, a latch 27, a column decoder 28, and a multiplexer (MUX) 29.

The timing generator 22 provides a timing signal and a control signal to the row decoder 23 and the column decoder 28.

The row driver 24 provides a plurality of driving signals to the active pixel sensor area 10 to drive the plurality of unit pixels according to the decoding result of the row decoder 23. In general, when the unit pixels are arranged in a matrix, the driving signal is provided to each row of unit pixels.

The correlated double sampler/analog-to-digital converter 26 receives the electric signal formed in the active pixel sensor area 10 via the vertical signal line and performs holding and sampling operations. That is, the correlated double sampler/analog-to-digital converter 26 double samples a predetermined reference voltage level (hereinafter, referred to as a "noise level") and a voltage level of the electric signal (hereinafter, referred to as a "signal level") and outputs a differential level corresponding to the difference between the noise level and the signal level. The correlated double sampler/analog-to-digital converter 26 converts an analog signal corresponding to the differential level into a digital signal and then outputs the digital signal.

The latch 27 latches the digital signal. The latched signal is supplied to the MUX 29. The MUX 29 arranges all the supplied signals in series, and provides the signals arranged in series to an image signal processor.

Figure 2:
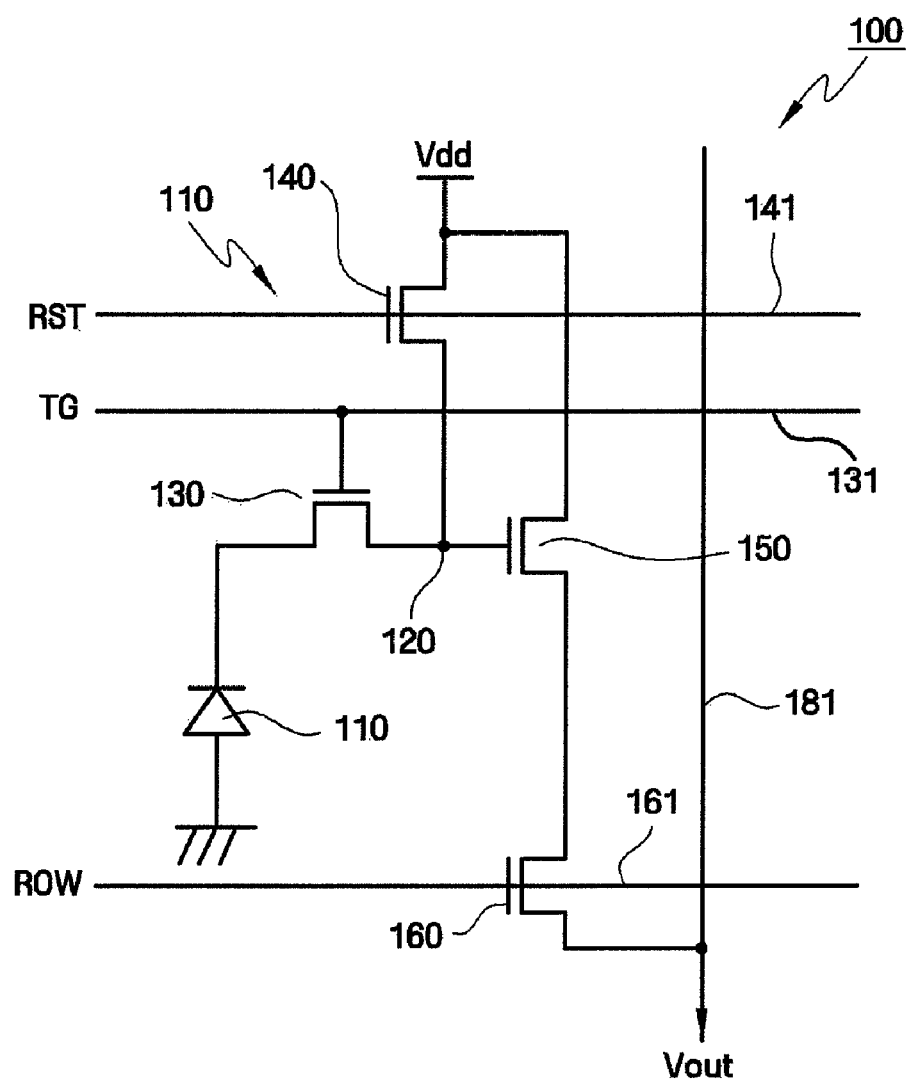
FIG. 2 is a circuit diagram illustrating an image sensor according to an exemplary embodiment of the invention.

FIG. 2 is a circuit diagram of an image sensor according to an exemplary embodiment of the invention.

Referring to FIG. 2, a unit pixel 100 of the image sensor 1 according to an exemplary embodiment of the invention includes a photoelectric converter 110, a charge detector 120, a charge transmitter 130, a reset unit 140, an amplifier 150, and a selector 160.

The photoelectric converter 110 absorbs the energy of light reflected from an object and stores charge corresponding to the energy of the light. The photoelectric converter 110 may be a photodiode, a phototransistor, a photogate, a pinned photodiode (PPD), or a combination thereof.

The charge detector 120 is implemented as a floating diffusion (FD) region and receives the charge stored in the photoelectric converter 110. As the charge detector 120 has parasitic capacitance, the electric charge is cumulatively stored in the charge detector 120. The charge detector 120 is electrically connected to a gate of the amplifier 150 and controls the amplifier 150.

The charge transmitter 130 transmits the charge from the photoelectric converter 110 to the charge detector 120. In general, the charge transmitter 130 includes a transistor and is controlled by a charge transmission signal TG.

The reset unit 140 periodically resets the charge detector 120. A source of the reset unit 140 is connected to the charge detector 120, and a drain thereof is connected to a power supply voltage terminal Vdd. The reset unit 140 operates in response to the reset signal RST.

The amplifier 150 in combination with a constant current source positioned outside the unit pixel 100 functions as a source follower buffer amplifier. A voltage varying in response to the voltage of the charge detector 120 is output from the amplifier 150 to a vertical signal line 181. A source of the amplifier 150 is connected to a drain of the selector 160 and a drain thereof is connected to the power supply voltage terminal Vdd.

The selector 160 selects each row of unit pixels 100 to be read. The selector 160 operates in response to the pixel selection signal ROW, and a source of the selector 160 is connected to the vertical signal line 181.

In addition, driving signal lines 131, 141, and 161 of the charge transmitter 130, the reset unit 140, and the selector 160 extend in a row direction (horizontal direction) such that the unit pixels belonging to the same row are simultaneously driven.

Figure 3:
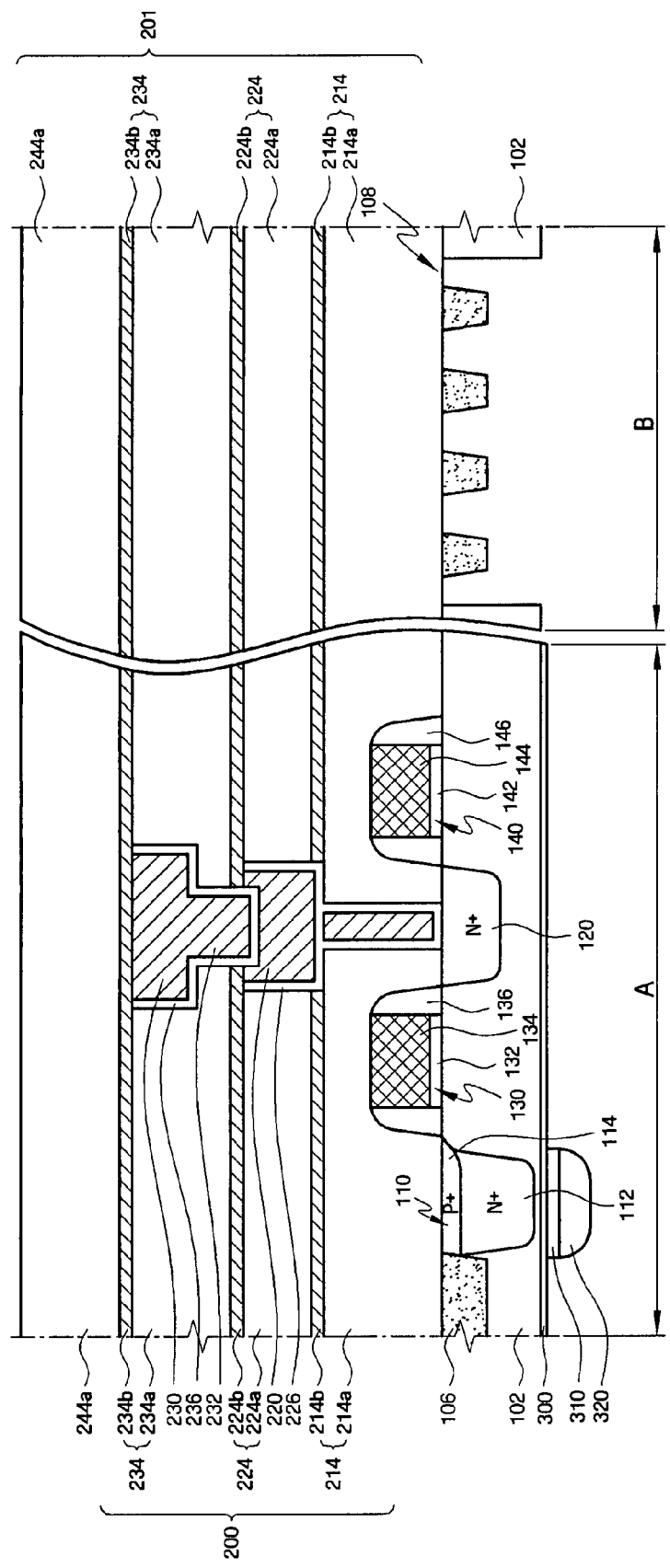
FIG. 3 is a cross-sectional view of an image sensor according to an exemplary embodiment of the invention before a scribe lane area is cut.

FIG. 3 is a cross-sectional view of an image sensor before a scribe lane area is cut according to an exemplary embodiment of the invention.

Referring to FIG. 3, in the image sensor 1 according to an exemplary embodiment of the invention, a device isolation region 106 is formed on a semiconductor substrate 102 in an active pixel sensor area A, and alignment keys 108 are formed on the semiconductor substrate 102 in a scribe lane area B.

As shown in FIG. 3, the image sensor 1 is a back-illuminated image sensor in which a microlens 320 is formed on a rear surface of the semiconductor substrate 102.

In the image sensor 1, before the scribe lane area B is cut, the active pixel sensor area A and the scribe lane area B are formed on the semiconductor substrate 102. A plurality of unit pixels are arranged in a matrix in the active pixel sensor area A. Each unit pixel includes the device isolation region 106, the photoelectric converter 110, the charge detector 120, the charge transmitter 130, the reset unit 140, and a first insulating film structure 200. However, for the purpose of convenience of explanation, a pinned photodiode (PPD) is used as an example of the photoelectric converter 110.

The alignment keys 108, used for alignment when the photoelectric converter 110, the charge detector 120, the charge transmitter 130, the reset unit 140, and wiring lines, are formed in the scribe lane area B. For example, the alignment keys 108 may be used for alignment when the microlenses 320 are formed on the rear surface of the semiconductor substrate 102, which will be described in detail below with reference to the drawings.

First, the active pixel sensor area A will be described with reference to FIG. 3.

A P-type substrate is mainly used as the semiconductor substrate 102. For example, the photoelectric converter 110, the charge transmitter 130, and the reset unit 140 may be formed on a P-type epitaxial layer and/or a well region by growing the P-type epitaxial layer on the semiconductor substrate 102 or providing a separate well region thereon.

The device isolation region 106 defines an active region on the semiconductor substrate 102. In general, the device isolation region 106 may be a field oxide (FOX) or shallow trench isolation (STI) region formed using, for example, a LOCOS (local oxidation of silicon) method.

The photoelectric converter 110 absorbs light energy to generate charge and stores the charge. The photoelectric converter 110 includes an $N^+$-type photodiode 112 and a $P^+$-type pinning layer 114. In general, the photodiode 112 and the pinning layer 114 are formed by two different ion implantation processes.

In the image sensor according to the related art, the surface damage of the photodiode 112 causes a dark current. The surface damage may be caused by dangling silicon bonds, or it may be caused by defects related to etching stress during the manufacture of, for example, a gate or a spacer. When the photodiode 112 is formed deep in the semiconductor substrate 102 and then the pinning layer 114 is formed, it is possible to prevent the dark current and to easily transmit charge generated by light energy.

The charge detector 120 receives the charge stored in the photoelectric converter 110 via the charge transmitter 130. The charge detector 120 is formed by implanting ions of an $N^+$ dopant.

The charge transmitter 130 is formed of a transistor, which is a switching element, and includes a first gate insulating film 132, a first gate electrode 134, and a first spacer 136.

The reset unit 140 is also formed of a transistor, which is a switching element, and includes a second gate insulating film 142, a second gate electrode 144, and a second spacer 146.

The first insulating film structure 200 includes a plurality of insulating films 214, 224, and 234, a plurality of contacts 212 and 232 formed in the insulating films so as to pass through the insulating films, and a plurality of wiring lines 220 and 230.

The first interlayer insulating film 214 is formed on the semiconductor substrate 102, and may be formed of an oxide film 214a or a combination of the oxide film 214a and a nitride film 214b. The oxide film 214a has a thickness of about 1000 to about 3000 angstroms (Å). The nitride film 214b prevents materials forming the lower contact 212 and the lower wiring line 220 from being diffused. The nitride film 214b may have a thickness of about 1000 to about 3000 Å, preferably, about 300 to about 700 Å. The nitride film 214b may further contain impurities, such as oxygen.

The lower contact 212 is formed in a predetermined portion of the first insulating film 214 and electrically connects the charge detector 120 and the lower wiring line 220. The lower contact 212 may be formed of a metallic material, such as, for example, copper, titanium, or tungsten. A first barrier film pattern 216 is formed around the lower contact 212 to prevent the material forming the lower contact 212 from being diffused into the first insulating film 214. When the lower contact 212 is formed of titanium or tungsten, the first barrier film pattern 216 may not be formed. The first barrier film pattern 216 may be formed of, for example, a tantalum (Ta) film, a tantalum nitride (TaN) film, or a laminated film of a tantalum film and a tantalum nitride film.

The second interlayer insulating film 224 is formed on the first interlayer insulating film 214, and may be formed of an oxide film 224a or a combination of the oxide film 224a and a nitride film 224b. The oxide film 224a has a thickness of about 5000 to about 7000 Å. The nitride film 224b has a thickness of about 200 to about 1000 Å.

The lower wiring line 220 is formed in a predetermined portion of the oxide film 224a of the second interlayer insulating film so as to be electrically connected to the lower contact 212, and is formed of a metallic material, such as, for example, copper or aluminum. A second barrier film pattern 226 is formed around the lower wiring line 220 to prevent the material forming the lower wiring line 220 from being diffused into the oxide film 224a of the second interlayer insulating film.

The third interlayer insulating film 234 is formed on the second interlayer insulating film 224, and may be formed of an oxide film 234a or a combination of the oxide film 234a and a nitride film 234b.

The first wiring line 230 and the first via contact 232 are formed in a predetermined portion of the third interlayer insulating film 234, and are formed of a metallic material, such as, for example, copper or aluminum. The first wiring line 230 transmits a predetermined signal, and the first via contact 232 electrically connects the lower wiring line 220 to the first wiring line 230. A third barrier film pattern 236 is formed around the first wiring line 230 and the first via contact 232 to prevent the material forming the first wiring line 230 and the first via contact 232 from being diffused into the third interlayer insulating film 234.

The fourth interlayer insulating film 244 is formed on the third interlayer insulating film 234.

The first to fourth interlayer insulating films 214 to 244 are given as examples of interlayer insulating films including a plurality of wiring layers, but the exemplary embodiments of the present invention are not limited thereto. The number of interlayer insulating films may vary according to the structure of an image sensor.

The insulating film structure 200 may further include an opening portion provided at a position corresponding to the photoelectric converter 110 for the photoelectric converter 110 to easily collect light.

A planarizing film 300 is formed on the rear surface of the semiconductor substrate 102. A color filter 310 and a domical microlens 320 are formed on the planarizing film 300 at a position corresponding to the photoelectric converter 110. The microlens 320 formed on the rear surface of the semiconductor substrate 102 makes it possible to form a back-illuminated image sensor 1 in which light illuminated from the rear side of the semiconductor substrate 102 is incident on the photoelectric converter 110. The back-illuminated image sensor 1 can prevent the aperture ratio with respect to the photoelectric converter 110 from being lowered due to the layout of multi-layer wiring lines.

Next, the scribe lane area B will be described below with reference to FIG. 3.

The rear surface of the semiconductor substrate 102 in the scribe lane area B is etched so that a plurality of alignment keys 108 are exposed. A second insulating film structure 201 may include a plurality of insulating films 214, 224, 234, and 244 and a plurality of wiring lines 220 and 230. In the scribe lane area B, the same components as those in the active pixel sensor area A have the same reference numerals, and a detailed description thereof will be omitted.

In the image sensor 1 according to an exemplary embodiment of the invention, the microlens 320 may be formed at a position corresponding to the photoelectric converter 110 on the rear surface of the semiconductor substrate 102 polished by using the alignment keys 108 of the scribe lane area B. As described above, the alignment keys 108 may be used for alignment when the photoelectric converter 110, the charge detector 120, the charge transmitter 130, and the reset unit 140 are formed, and it may also be used for alignment when the microlens 320 is formed on the polished rear surface of the semiconductor substrate 102. As a result, an additional process for forming the alignment keys required forming the microlens 320 on the rear surface of the semiconductor substrate is not needed, which makes it possible to reduce the number of processes.

Figure 4A:
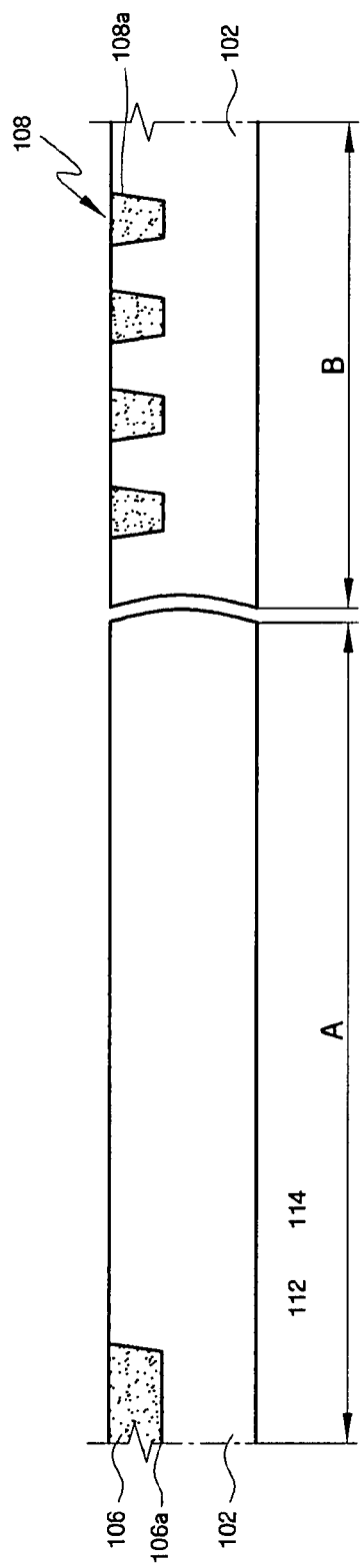
FIGS. 4A to 4O are cross-sectional views illustrating a method of manufacturing an image sensor according to an exemplary embodiment of the invention.

FIGS. 4A to 4O are diagrams illustrating a method of manufacturing an image sensor according to an exemplary embodiment of the invention.

First, referring to FIG. 4A, in the image sensor 1 according to an exemplary embodiment of the invention, the device isolation region 106 is formed in the active pixel sensor area A of the semiconductor substrate 102, and the alignment keys 108 are formed in the scribe lane area B of the semiconductor substrate 102.

The alignment keys 108 may be used in the subsequent process of forming, for example, photoelectric converters, transistors, and a plurality of wiring layers on the semiconductor substrate 102. In addition, the alignment keys 108 may be used for alignment when the microlens is formed on the rear surface of the semiconductor substrate 102.

A first trench 106a is formed in the active pixel sensor area A, and a second trench 108a is formed in the scribe lane area B. In this case, the depth of the second trench 108a is equal to or smaller than the depth of the first trench 106a. The depth of the second trench 108a may be in the range of about 400 to about 500 Å. The second trench 108a having a small depth makes it possible to reduce the number of processes for forming the alignment keys 108. That is, it is possible to readily form and fill up the trench by forming the second trench 108a having a low aspect ratio.

Then, after the first and second trenches 106a and 108a are formed, the first and second trenches 106a and 108a are filled up with an insulating material. The insulating material may be an oxide film, but is not limited thereto. Any material may be used as the insulating material as long as it has substantially the same etching selectivity as the first interlayer insulating film to be formed on the photoelectric converter 110.

According to an exemplary embodiment of the invention, the trench for the device isolation region 106 in the active pixel sensor area A and the trenches for the alignment keys 108 in the scribe lane area B are formed at the same time. This means that a process of forming the alignment keys for alignment when the microlens is formed on the rear surface of the semiconductor substrate 102 is not separately performed. Therefore, according to the manufacturing method of the embodiment of the invention, the alignment keys 108 for alignment when the microlens is formed can be formed before the device isolation region 106 is formed in the active pixel sensor area A.

Figure 4B:
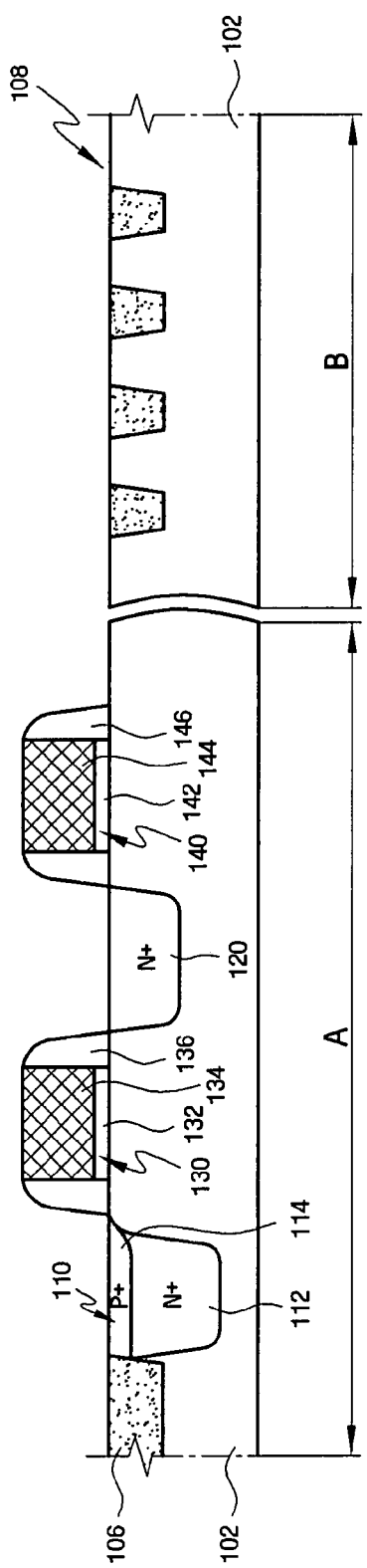

Referring to FIG. 4B, the device isolation region 106 is formed in the semiconductor substrate 102, and the photoelectric converter 110, the charge detector 120, the charge transmitter 130, and the reset unit 140 are formed on the semiconductor substrate 102 in the active pixel sensor area A. For example, the photoelectric converter 110, the charge detector 120, the charge transmitter 130, and the reset unit 140 may be formed on a P-type epitaxial layer and/or a well region by growing the P-type epitaxial layer on the semiconductor substrate 102 or providing a separate well region thereon.

The photoelectric converter 110 includes the $N^+$-type photodiode 112 and the $P^+$-type pinning layer 114, and the photodiode 112 and the pinning layer 114 are formed by two different ion implantation processes. That is, ions of an $N^+$ dopant are implanted into the semiconductor substrate 102 below neighboring source and drain to form the photodiode 112. Then, ions of a $P^+$ dopant are implanted on the photodiode 112 with low energy and a high dose to form the pinning layer 114. Of course, the concentration and implantation position of a dopant can vary according to the manufacturing process and the design. Therefore, the exemplary embodiments of the present invention are not limited thereto.

The charge detector 120 is mainly formed by implanting ions of an $N^+$ dopant.

The charge transmitter 130 is formed by forming the first gate electrode 134 on the first gate insulating film 132 and forming the first spacers 136 at both sides of the first gate electrode 134. The reset unit 140 is formed in the same manner as described above.

Figure 4C:
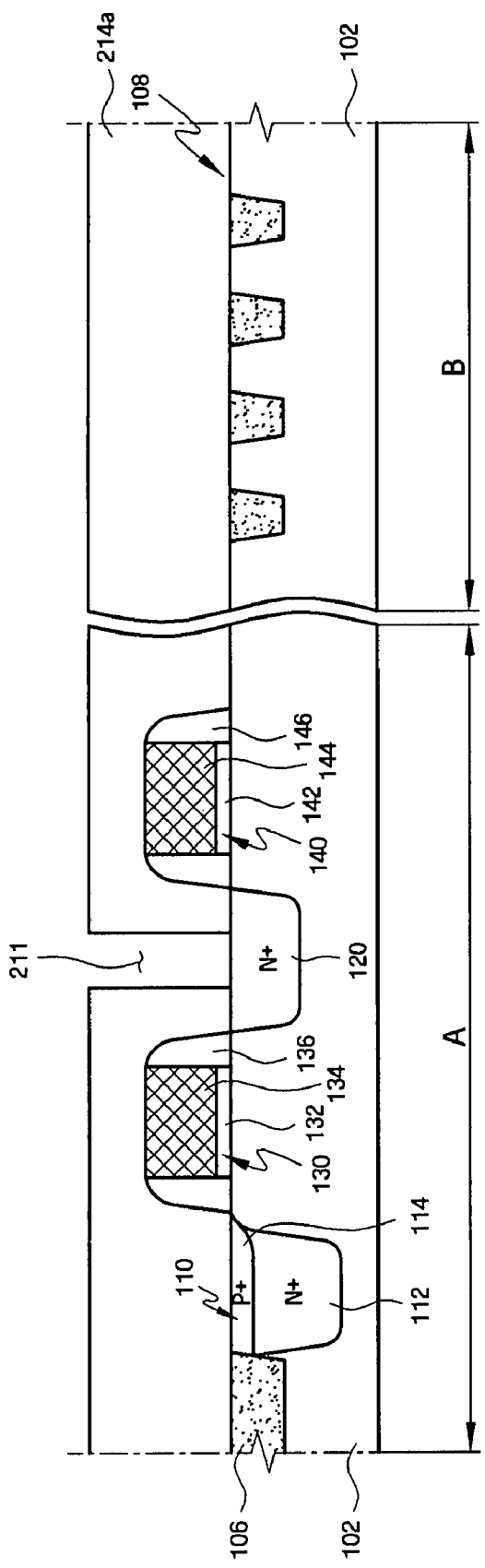

Next, referring to FIG. 4C, the oxide film 214a of the first interlayer insulating film is formed so as to cover the entire surface of the semiconductor substrate 102 having the charge transmitter 130 and the reset unit 140 formed thereon. Also, the oxide film 214a of the first interlayer insulating film is formed on the scribe lane area B having the alignment keys 108 formed therein. Then, a general etching process is performed on the oxide film 214a of the first interlayer insulating film to form a lower contact hole 211 for allowing the surface of the charge detector 120 to be exposed. An additional process of forming a contact hole is not performed on the scribe lane area B.

Figure 4D:
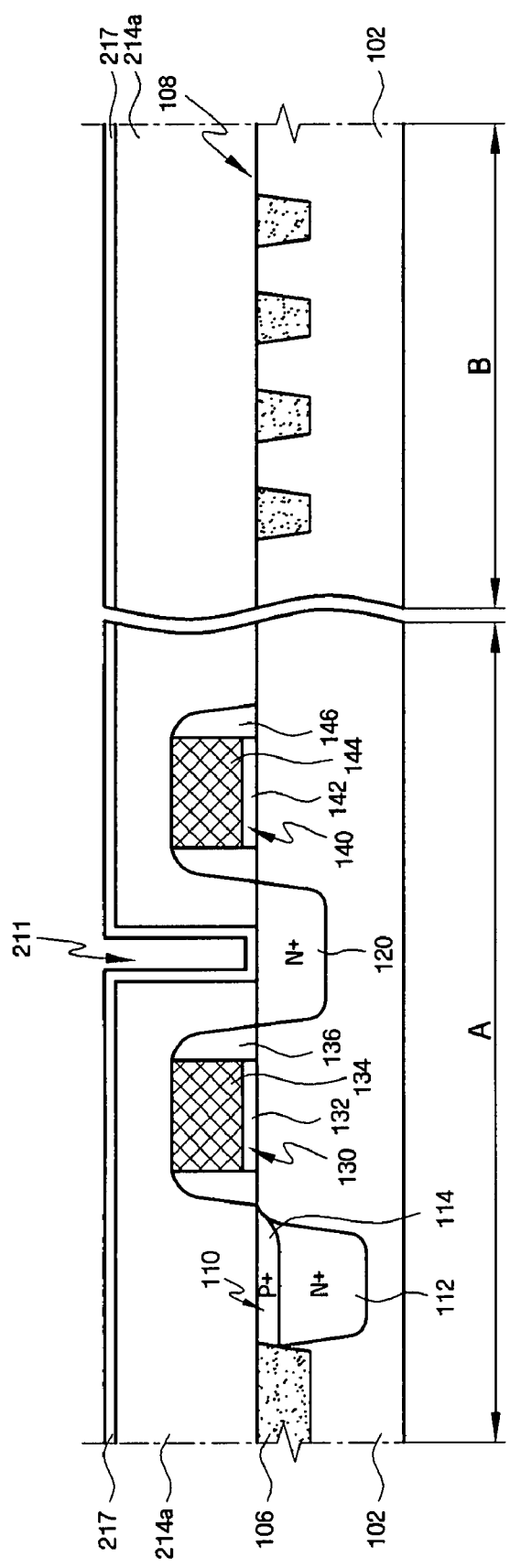

Then, referring to FIG. 4D, a first barrier film 217 is conformally formed with a thickness of about 50 to about 500 Å along the profiles of the side and bottom of the lower contact hole 211 of the active pixel sensor area A and the upper surface of the oxide film 214a of the first interlayer insulating film.

When copper is deposited as the lower contact 212 in the subsequent process, the first barrier film 217 prevents copper from being diffused into the oxide film 214a of the first interlayer insulating film. The first barrier film 217 may be formed of, for example, a tantalum (Ta) film, a tantalum nitride (TaN) film, or a laminated film of a tantalum film and a tantalum nitride film. As described above, when the lower contact 212 is formed of titanium or tungsten, the first barrier film 217 may not be formed.

Figure 4E:
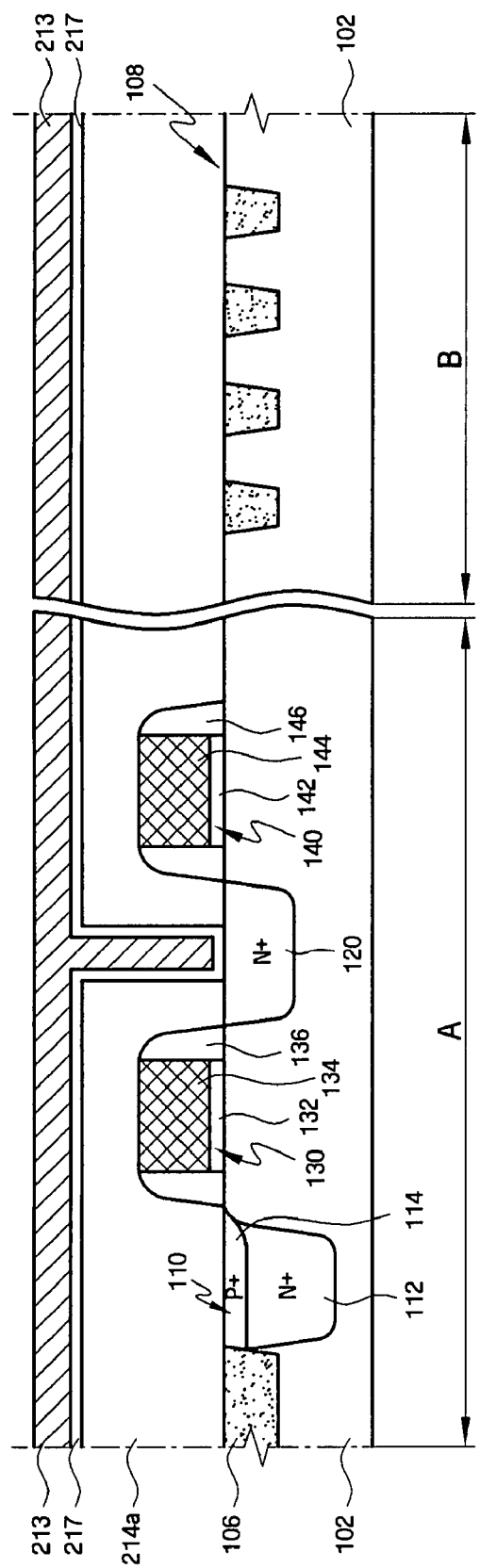

Referring to FIG. 4E, a metallic material, such as, for example, copper, titanium, or tungsten, is deposited on the first barrier film 217 so as to fill up the lower contact hole (see reference numeral 211 in FIG. 4D), thereby forming a first lower metal layer 213.

As copper is readily diffused into the semiconductor substrate 102, it is preferable to use, for example, titanium or tungsten. The tungsten or titanium is deposited by, for example, a chemical vapor deposition (CVD) method or a sputtering method.

Figure 4F:
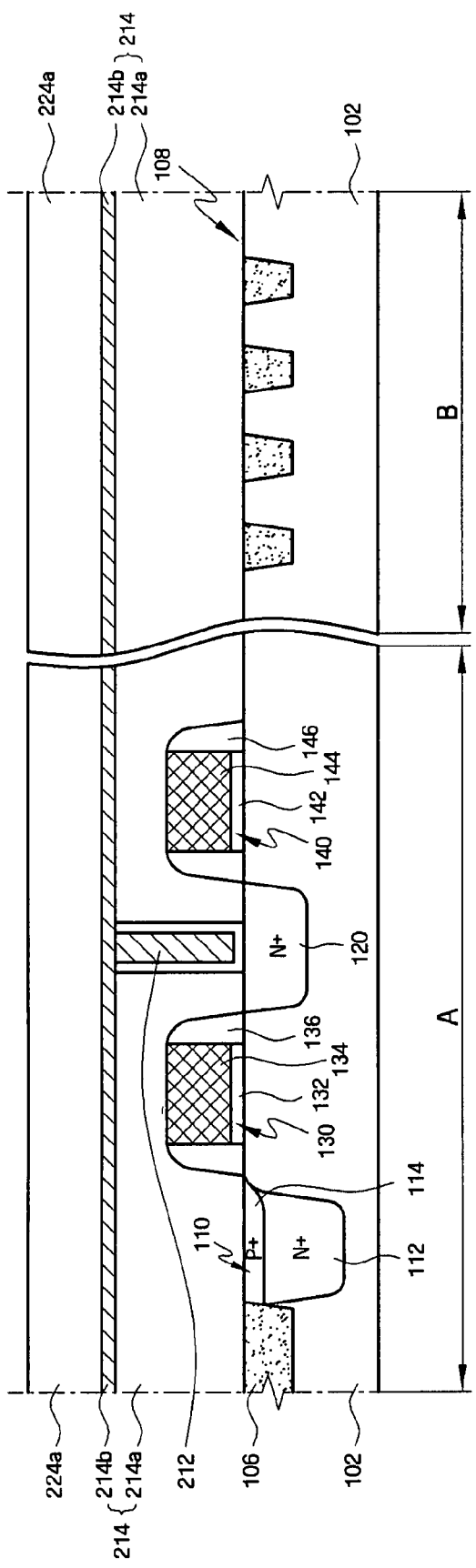

Referring to FIG. 4F, the first lower metal layer (see reference numeral 213 in FIG. 4E) and the first barrier film (see reference numeral 217 in FIG. 4E) are polished by, for example, a chemical mechanical polishing (CMP) method until the surface of the first interlayer insulating film 214 is exposed, thereby forming the lower contact 212 filling up the lower contact hole (see reference numeral 211 in FIG. 4D). In this case, the first barrier film 217 remains on the side wall and the bottom of the lower contact 212 as the first barrier film pattern 216.

Then nitride film 214b is formed on the oxide film 214a of the first interlayer insulating film having the lower contact 212 formed therein. The nitride film 214b prevents the diffusion of copper in the subsequent heat treatment, and serves as an etching stopper in the etching process. The nitride film 214b is formed by a CVD method with a thickness of about 200 to about 1000 Å, preferably, about 300 to about 700 Å. The nitride film 214b may contain impurities, such as oxygen, if necessary.

Figure 4G:
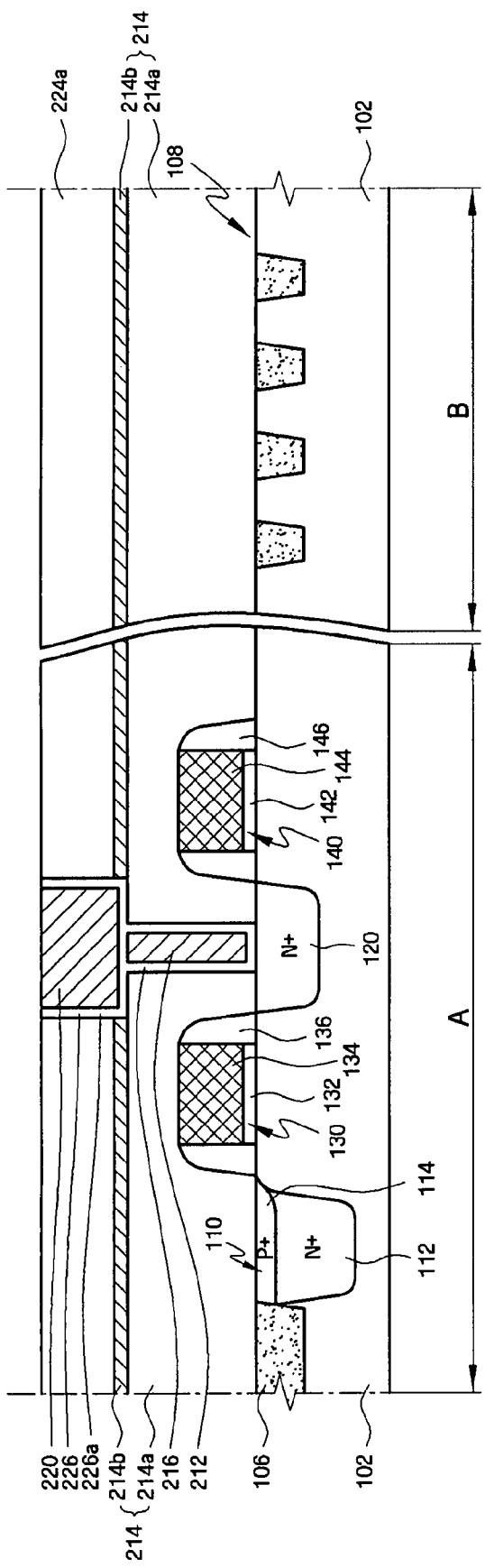

Referring to FIG. 4G, the oxide film 224a of the second interlayer insulating film is formed on the nitride film 214b.

A general etching process is performed on the oxide film 224a of the second interlayer insulating film and the nitride film 214b of the first interlayer insulating film to remove parts of the oxide film 224a and the nitride film 214b, thereby forming a first via 226a for allowing the lower contact 212 to be exposed. The second barrier film is conformally formed with a thickness of about 50 to about 500 Å along the profile of the first via 226a. When copper is deposited as the lower wiring line 220 in the subsequent process, the second barrier film prevents copper from being diffused into the oxide film 224a of the second interlayer insulating film 224 The second barrier film may be formed of, for example, a tantalum (Ta) film, a tantalum nitride (TaN) film, or a laminated film of a tantalum film and a tantalum nitride film. As described above, when the lower wiring line 220 is formed of titanium or tungsten, the second barrier film may not be formed.

Then, a second lower metal layer made of a metallic material, such as, for example, copper or aluminum, is formed on the second barrier film so as to fill up the first via 226a. When the second lower metal layer is formed of copper, first, a copper seed is deposited by the sputtering method, and an electroplating method is performed on the copper film. Alternatively, the second lower metal layer may be formed by, for example, an electroless plating method.

Subsequently, the second lower metal layer and the second barrier film are polished by the CMP method until the oxide film 224a of the second interlayer insulating film is exposed, thereby forming the lower wiring line 220. At that time, the second barrier film remains as the second barrier film pattern 226.

Figure 4H:
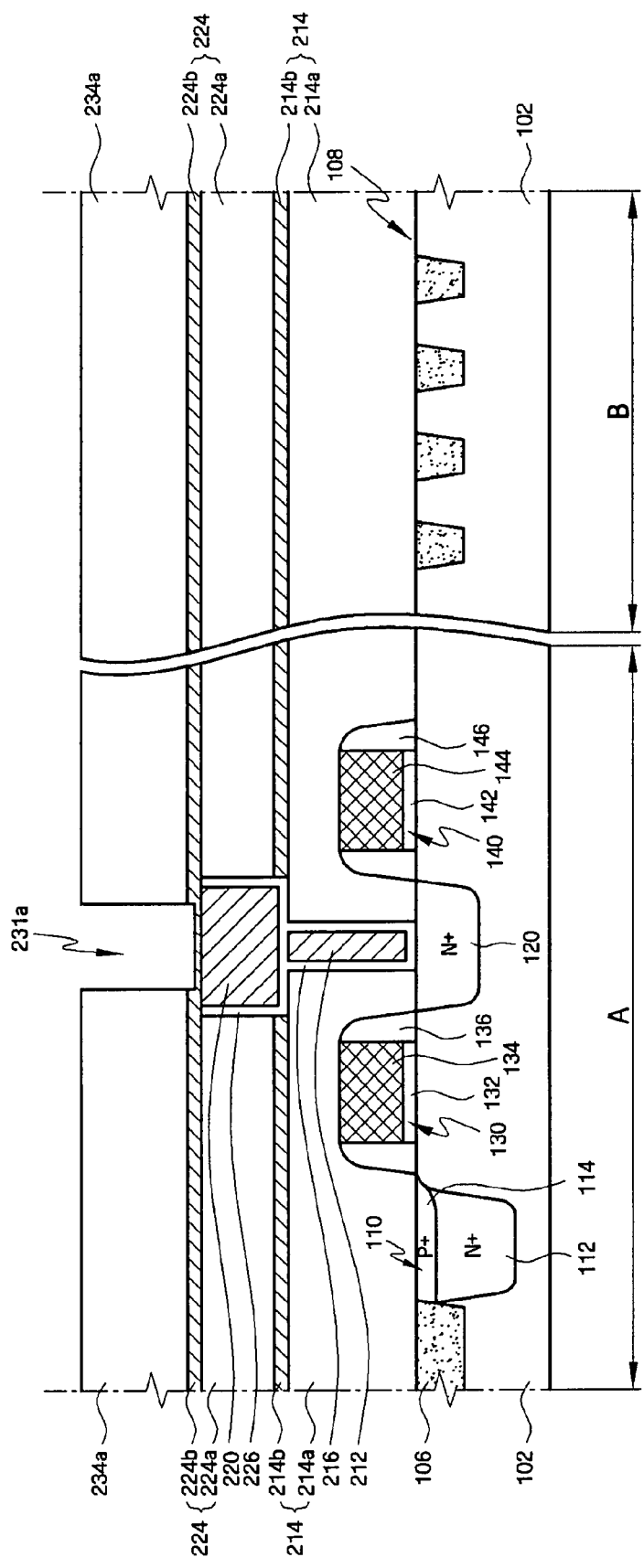

Referring to FIG. 4H, the nitride film 224b of the second interlayer insulating film is formed on the oxide film 224a of the second interlayer insulating film including the lower wiring line 220 with a thickness of about 200 to about 1000 Å, preferably, about 300 to about 700 Å. Then, the oxide film 234a of the third interlayer insulating film is formed on the nitride film 224b of the second interlayer insulating film with a thickness of about 5000 to about 20000 Å in the same manner as that used to form the oxide film 224a of the second interlayer insulating film.

A general etching process is performed on a predetermined portion of the oxide film 234a of the third interlayer insulating film disposed on the lower wiring line 220 to form a preliminary via hole 231a for allowing the nitride film 224b of the second interlayer insulating film to be exposed.

Figure 4I:
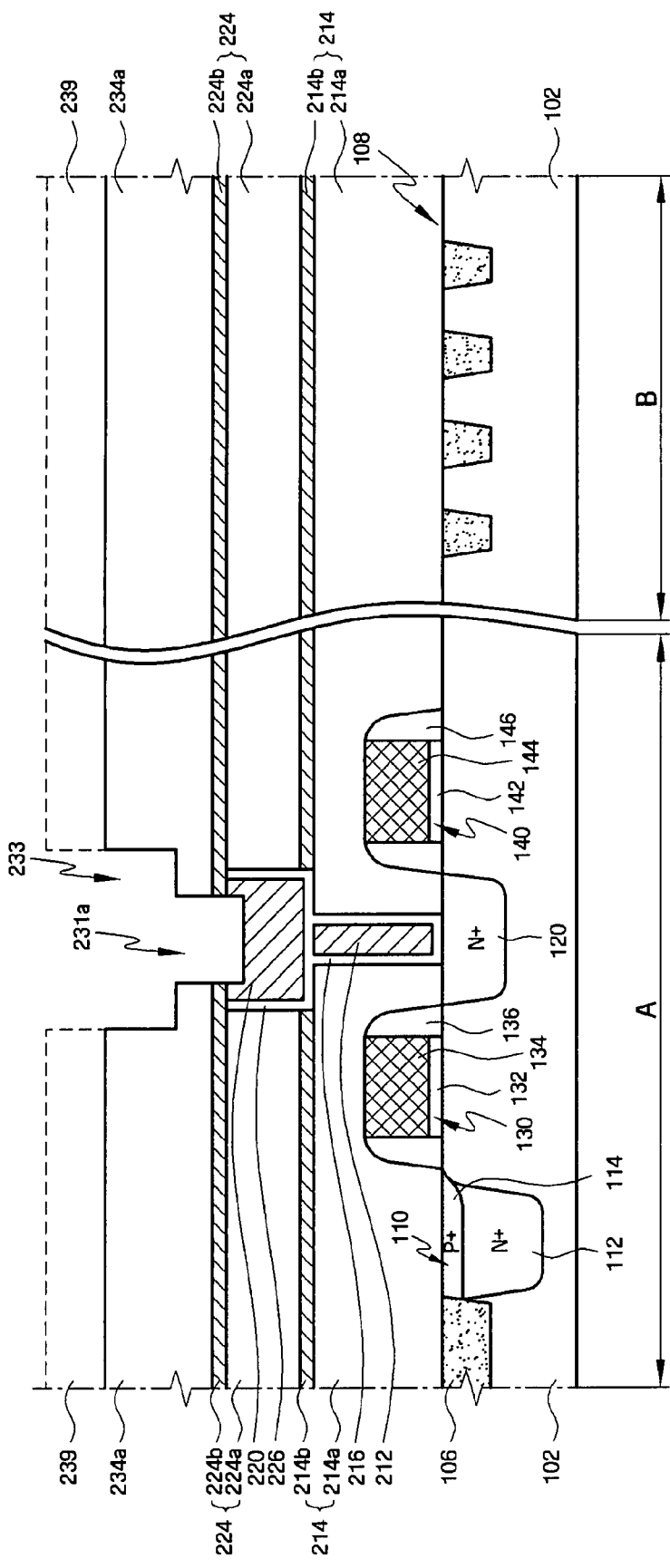

Referring to FIG. 4I, a photoresist pattern 239 for patterning a second trench 233 communicating with the preliminary via hole (see reference numeral 231a in FIG. 4E) is formed. A predetermined portion of the oxide film 234a of the third interlayer insulating film is etched at a depth of about 2000 to about 10000 Å by using the photoresist pattern 239 as an etching mask to form the second trench 233 at the upper side of the preliminary via hole 231a. While the etching process is performed, the bottom of the preliminary via hole 231a is exposed. However, as etching selectivity between the oxide film 234a of the third interlayer insulating film and the nitride film 224b of the second interlayer insulating film is high, the nitride film 224b of the second interlayer insulating film partially remains on the bottom of the preliminary via hole 231a.

In this exemplary embodiment of the invention, the preliminary via hole 231a is formed and then the second trench 233 is formed at the upper side of the preliminary via hole 231a. However, any process may be included in the exemplary embodiments of the invention as long as it can form the preliminary via hole 231a and the second trench 233. For example, the following processes may be sequentially performed: first, the oxide film 234a of the third interlayer insulating film including the preliminary via hole 231a is formed; the preliminary via hole 231a is filled with a conductive material to form a first via contact; the second trench 233 is formed; and the second trench 233 is filled with a conductive material to form a first wiring line. Alternatively, for example, the second trench 233 may be formed, and then the preliminary via hole 231a may be formed.

Thereafter, the photoresist pattern 239 is removed, and the nitride film 224b of the second interlayer insulating film remaining on the bottom of the preliminary via hole 231a is removed, thereby forming a first via hole 231b.

Figure 4J:
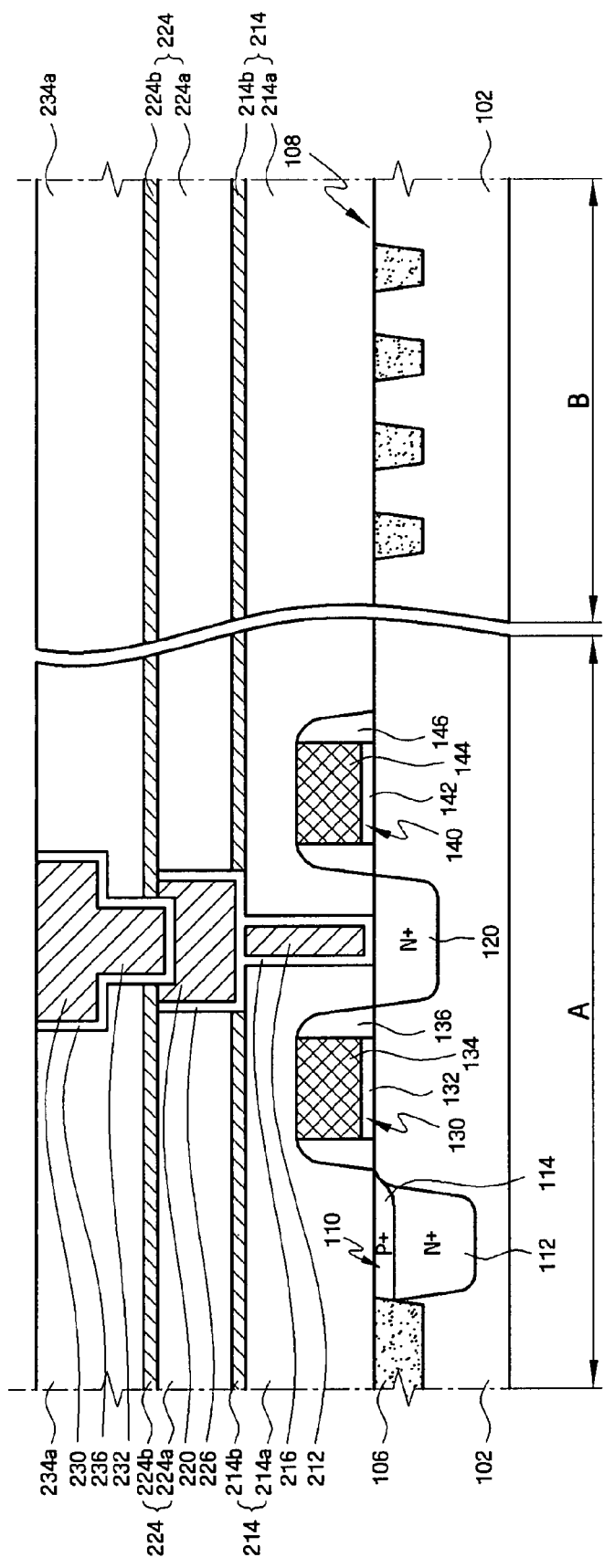

Referring to FIG. 4J, the third barrier film is formed along the profiles of the first via hole 231b and the second trench 233. A metallic material, such as, for example, aluminum or copper, is deposited to fill up the first via hole 231b and the second trench 233 to form a first wiring metal layer.

Then, the third barrier film and the first wiring metal film are polished by the CMP method until the upper surface of the oxide film 234a of the third interlayer insulating film is exposed, thereby forming the first wiring line 230 and the first via contact 232 at the same time. At that time, the third barrier film remains as the third barrier pattern 236.

Figure 4K:
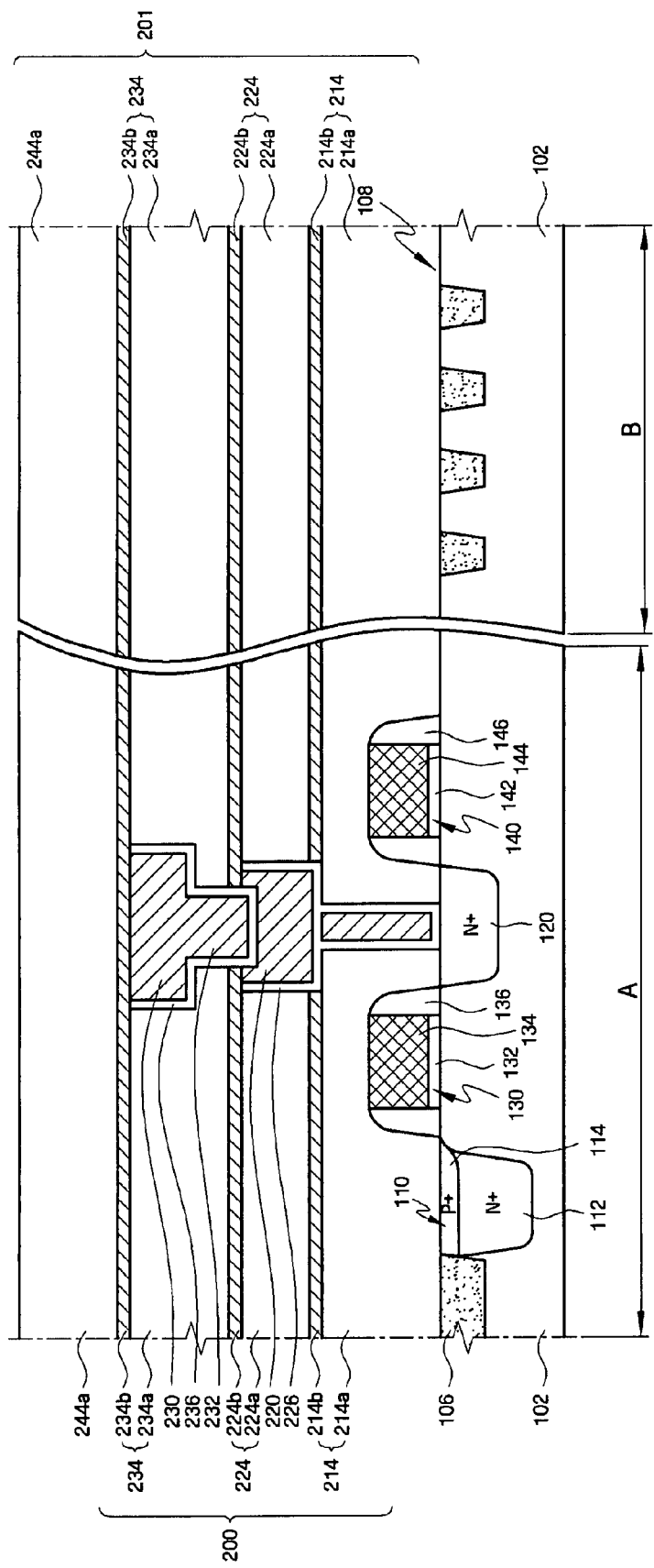

Referring to FIG. 4K, the nitride film 234b and an oxide film 244a of the fourth interlayer insulating film are formed on the oxide film 234a of the third interlayer insulating film through the same processes as those shown in FIGS. 4I and 4J. In this way, a multi-layer wiring line is formed. In this exemplary embodiment, for the purpose of convenience of explanation, a two-layer wiring line is formed as an example, but the exemplary embodiments of the invention are not limited thereto. In this exemplary embodiment, the wiring line is formed by a damascene process, but the exemplary embodiments of the invention are not limited thereto.

Figure 4L:
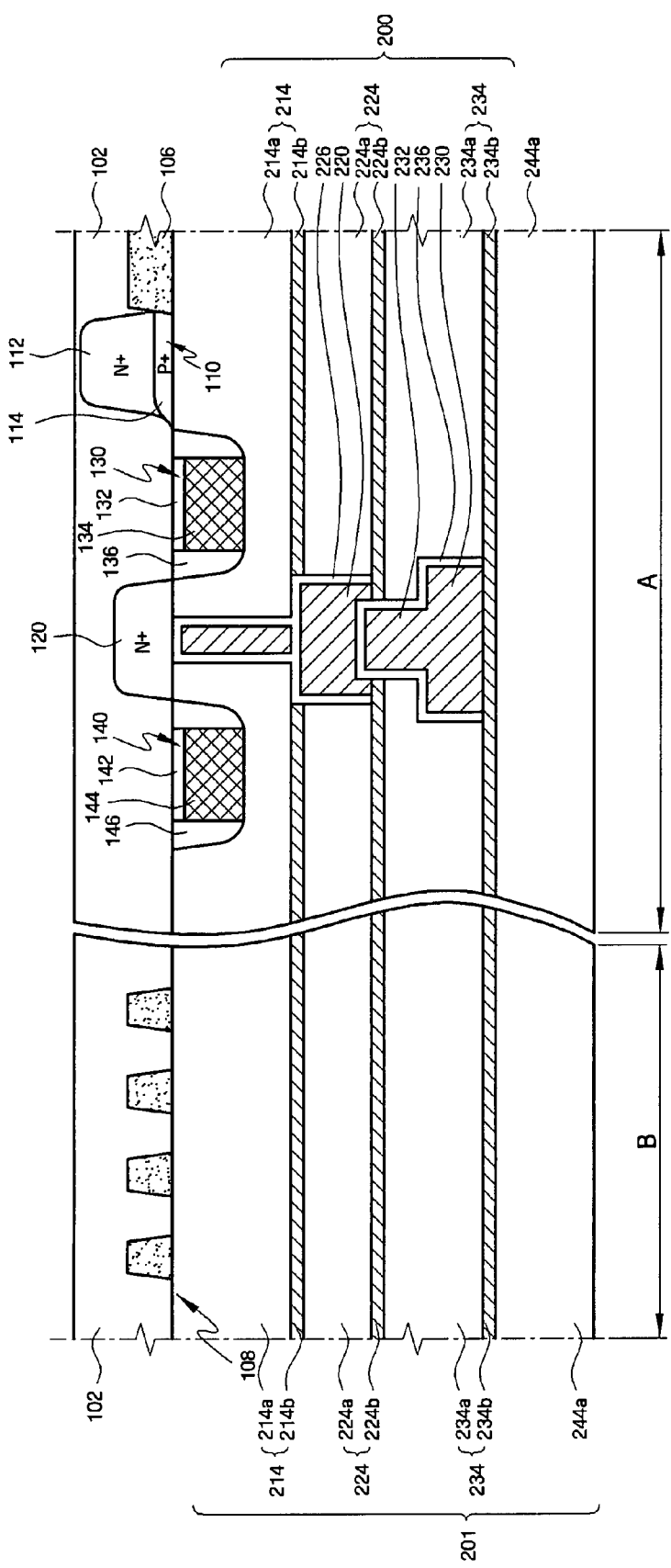

Next, referring to FIG. 4L, the rear surface of the semiconductor substrate 102 is polished.

First, the semiconductor substrate 102 is turned upside down, and the rear surface of the semiconductor substrate 102 is polished to a predetermined thickness. In general, the CMP process is used to polish the rear surface of the semiconductor substrate 102. In this way, a contaminant on the rear surface of the semiconductor substrate 102 is removed, and the thickness of silicon formed on the photoelectric converter 110 is reduced, which makes it possible to improve the sensitivity of light incident on the photoelectric converter 110.

Figure 4M:
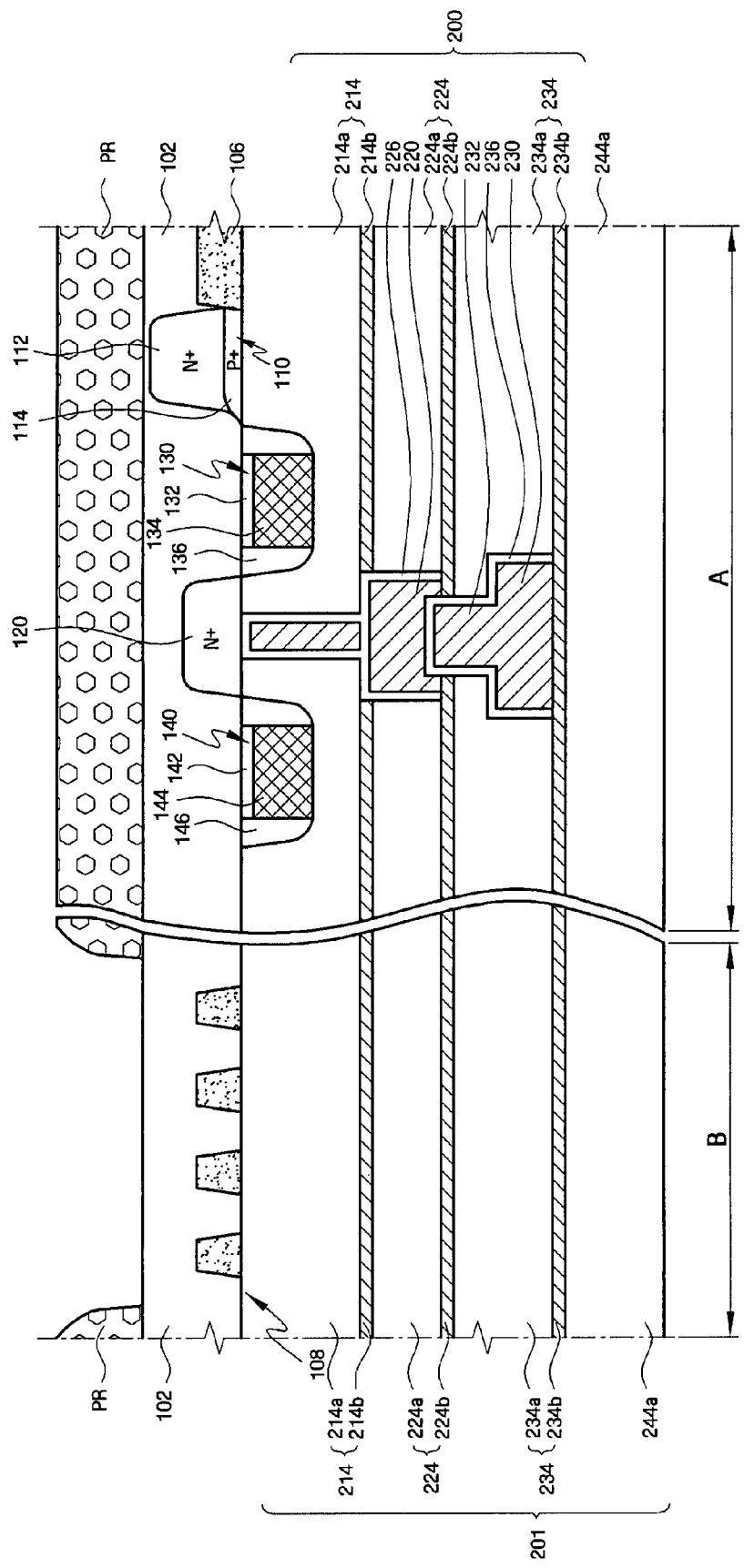

Then, referring to FIG. 4M, a mask pattern for opening the scribe lane area B is formed on the entire surface of the polished semiconductor substrate 102.

In this exemplary embodiment, a photosensitive mask pattern (PR pattern) is used as the mask pattern, but the exemplary embodiments of the invention are not limited thereto.

Figure 4N:
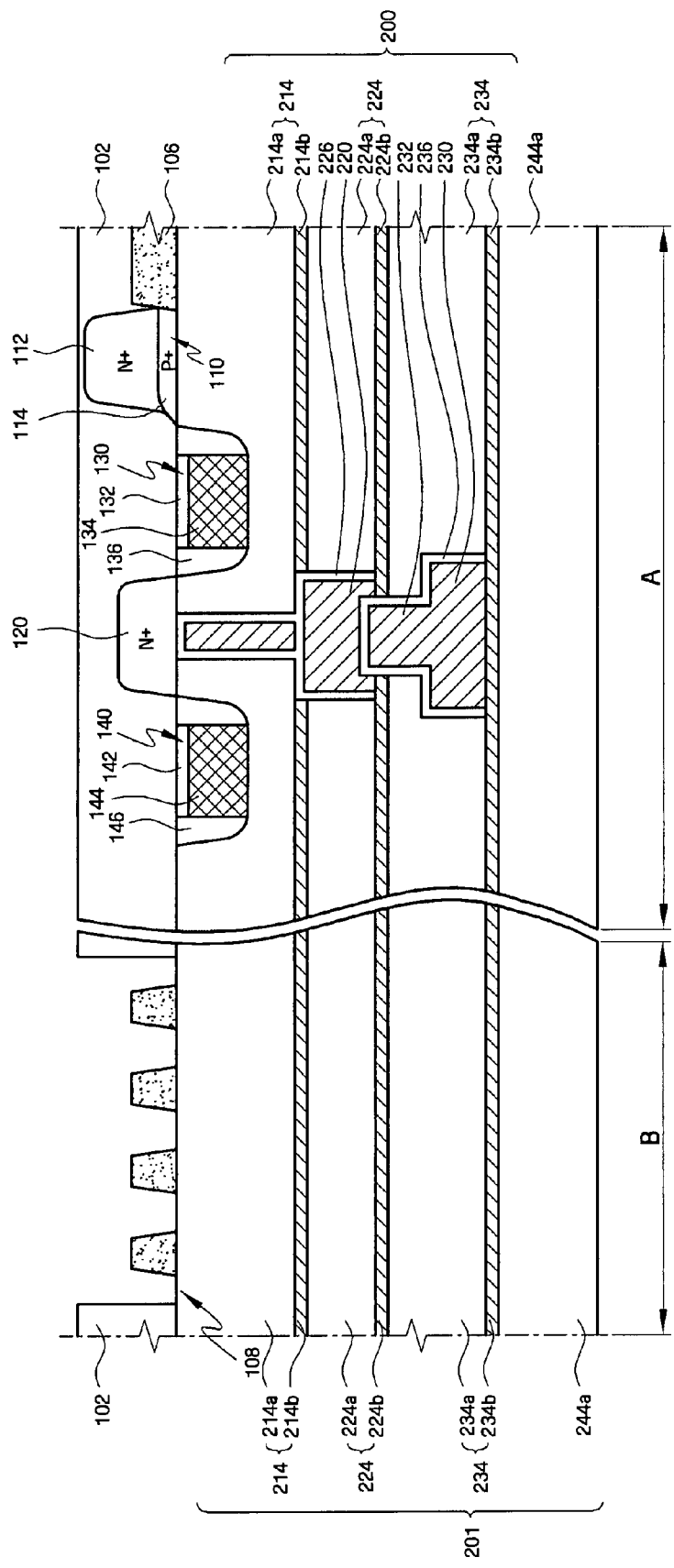

Next, referring to FIG. 4N, the polished rear surface of the semiconductor substrate 102 is etched by using the mask pattern (PR pattern) to expose the alignment keys 108. Then, the mask pattern (PR pattern) is removed.

In this case, as the insulating material forming the alignment keys 108 has low etching selectivity with respect to the semiconductor substrate 102, the alignment keys 108 are not etched while the polished rear surface of the semiconductor substrate 102 is being etched. As described above, the alignment keys 108 and the first interlayer insulating film 214 are formed to have the same etching selectivity. Therefore, when the polished rear surface of the semiconductor substrate 102 is etched, the alignment keys 108 and the first interlayer insulating film 214 can serve as etching stoppers.

In this way, the alignment keys 108 can be used as alignment marks for the positional alignment of a color filter and a microlens to be formed in the subsequent process.

Figure 40:
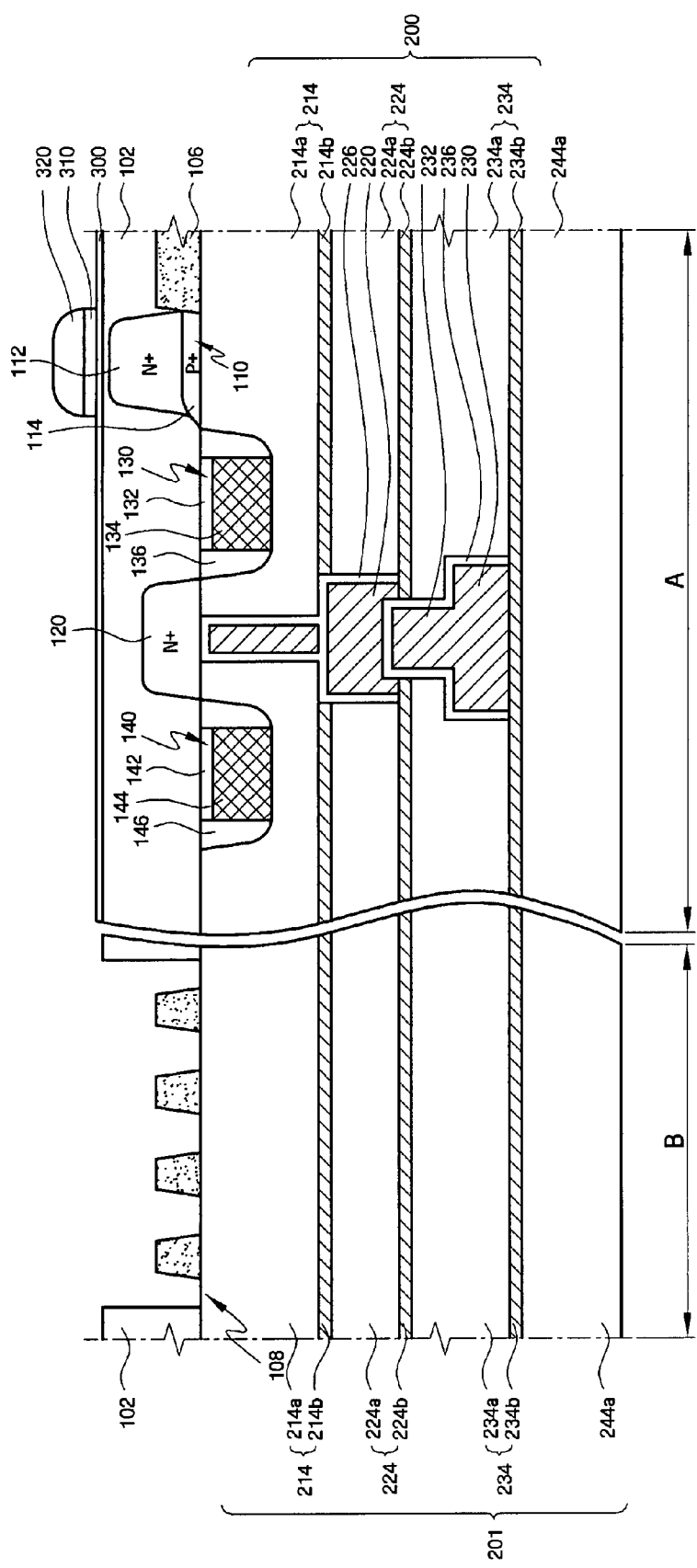

Then, referring to FIG. 40, the microlens 220 is formed at a position corresponding to the photoelectric converter 110.

First, the planarizing film 300 is formed on the polished semiconductor substrate 102 in the active pixel sensor area A.

The planarizing film 300 is formed to planarize the semiconductor substrate 102 before the color filter 310 is formed, and can prevent the deformation of the color filter 310 due to the direct contact of the color filter 310 with the semiconductor substrate 102. In this exemplary embodiment, the planarizing film 300 may be an over coating layer (OCL).

Then, the color filter 310 is formed at a position corresponding to the photoelectric converter 100 on the planarizing film 300 in the active pixel sensor area A by using the alignment keys 108 formed in the scribe lane area B.

The color filter 310 may be formed, for example, by coating a color filter forming material and patterning the material using a suitable mask. A dyed photoresist may be used as the color filter forming material. The color filter 310 may be, for example, any one of red (R), green, and blue color filters, or any one of yellow, magenta, and cyan color filters.

The microlens 320 is formed on the color filter 310 in the active pixel sensor area A by using the alignment keys 108 formed in the scribed lane area B.

A photoresist having high light transmittance may be used as the microlens 320. When the microlens 320 is formed at a position corresponding to the photoelectric converter 110, the microlens 320 is aligned on the basis of the alignment keys 108. For example, a photoresist for a microlens is applied and patterned. Then, when a reflow process is performed using a heating process, it is possible to form a hemispheric microlens 320. Another over coating layer may be interposed between the color filter 310 and the microlens 320.

With a method of manufacturing an image sensor by using the alignment keys 108 according to exemplary embodiments of the invention, an additional process of forming the alignment keys 108 may not be performed. That is, with exemplary embodiments of the invention, it is possible to reduce the number of processes by forming the device isolation region 106 in the active pixel sensor area A and the alignment keys 108 in the scribe lane area B at the same time. In addition, the alignment keys 108 are formed such that the depth thereof is equal to or smaller than the depth of the device isolation region 106, and thus the aspect ratio is lowered, which makes it possible to reduce the number of manufacturing processes. Further, the alignment keys 108 are formed in the scribe lane area B when the image sensor is manufactured, which makes it possible to use the alignment keys 108 as alignment marks without occupying an effective space.

According to the image sensor and the method of manufacturing the image sensor of exemplary embodiments of the invention, at least the following benefits set forth below can be obtained.

First, the device isolation region and the alignment keys of the scribed lane area are simultaneously formed, and thus an additional process of forming the alignment keys is not needed.

Second, the alignment keys are formed such that the depth thereof is equal to or smaller than the depth of the device isolation region, which makes it possible to easily perform a process of forming the alignment keys.

Third, the alignment keys are formed in the scribe lane area, which makes it possible to efficiently use an effective space of a semiconductor substrate.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing an image sensor, the method comprising:
    forming a device isolation region in an active pixel sensor area of a semiconductor substrate and alignment keys in a scribe lane area of the semiconductor substrate, such that the depth of the alignment keys is equal to or shallower than the depth of the device isolation region;
    forming a photoelectric converter in the active pixel sensor area;
    polishing a rear surface of the semiconductor substrate; and
    using the alignment keys to form a microlens at a position corresponding to the photoelectric converter on the polished rear surface of the semiconductor substrate,
    wherein the using of the alignment keys comprises:
    forming a mask pattern for opening the scribe lane area on the entire polished rear surface of the semiconductor substrate; and
    etching the polished rear surface of the semiconductor substrate using the mask pattern to expose the alignment keys.

2. The method of claim 1, wherein the forming of the device isolation region and the alignment keys comprises:
    forming a first trench in the active pixel sensor area and a second trench in the scribe lane area; and
    filling up the first and second trenches with an insulating material.

3. The method of claim 2, wherein the first and second trenches are simultaneously formed.

4. The method of claim 2, wherein the insulating material of the second trench has substantially the same etching selectivity as an interlayer insulating film formed on the photoelectric converter.

5. The method of claim 4, wherein the insulating material is an oxide film.

6. The method of claim 2, wherein the insulating material of the second trench has a low etching selectivity with respect to the semiconductor substrate.

7. The method of claim 5, wherein the insulating material is an oxide film.

8. The method of claim 2, wherein depth of the second trench is formed about 400 to about 500 angstroms (Å).

9. The method of claim 1, further comprising:
    forming a color filter at the position corresponding to the photoelectric converter before forming the microlens.

10. A method of manufacturing an image sensor, the method comprising:
    forming a device isolation region in an active pixel sensor area of a semiconductor substrate and alignment keys in a scribe lane area of the semiconductor substrate, such that the depth of the alignment keys is equal to or shallower than the depth of the device isolation region;
    forming a photoelectric converter in the active pixel sensor area;

forming a multi-layer wiring line in an interlayer insulating film formed on the active pixel sensor area;

polishing a rear surface of the semiconductor substrate;

forming a mask pattern for opening the scribe lane area on the entire polished rear surface of the semiconductor substrate;

etching the polished rear surface of the semiconductor substrate using the mask pattern to expose the alignment keys; and using the alignment keys to form a microlens at a position corresponding to the photoelectric converter on the polished rear surface of the semiconductor substrate.

11. The method of claim 10, wherein the forming of the device isolation region and the alignment keys comprises:

forming a first trench in the active pixel sensor area and a second trench in the scribe lane area; and filling up the first and second trenches with an insulating material.

12. The method of claim 11, wherein the first and second trenches are simultaneously formed.

13. The method of claim 11, wherein the insulating material of the second trench has substantially the same etching selectivity as an interlayer insulating film formed on the photoelectric converter.

14. The method of claim 13, wherein the insulating material is an oxide film.

15. The method of claim 11, wherein the insulating material of the second trench has a low etching selectivity with respect to the semiconductor substrate.

16. The method of claim 15, wherein the insulating material is an oxide film.

17. The method of claim 11, wherein depth of the second trench is about 400 to about 500 angstroms (Å).

18. The method of claim 11, further comprising:

forming a color filter at the position corresponding to the photoelectric converter before forming the microlens.

* * * * *